(12) United States Patent
Teng et al.

(10) Patent No.: US 10,074,702 B2
(45) Date of Patent: Sep. 11, 2018

(54) ORGANIC LIGHT EMITTING DIODE DISPLAY PANEL

(71) Applicant: InnoLux Corporation, Miao-Li County (TW)

(72) Inventors: Wei-Chieh Teng, Miao-Li County (TW); Jin-Ju Lin, Miao-Li County (TW); Neng-Jung You, Miao-Li County (TW); Wei-Chih Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/230,514

(22) Filed: Aug. 8, 2016

(65) Prior Publication Data

US 2017/0047385 A1     Feb. 16, 2017

(30) Foreign Application Priority Data

Aug. 14, 2015 (TW) .............................. 104126504 A (51) Int. Cl.
*H01L 27/32* (2006.01)
*H01L 51/00* (2006.01)

(52) U.S. Cl.
CPC ...... *H01L 27/3246* (2013.01); *H01L 51/0004* (2013.01)

(58) Field of Classification Search
CPC .......................... H01L 27/3246; H01L 51/0004
See application file for complete search history.

(56) References Cited

U.S. PATENT DOCUMENTS

| 7,254,306 | B2 * | 8/2007 | Burie ................. G02B 6/12004 385/131 |
| 2001/0022885 | A1 * | 9/2001 | Yamada ................... H01S 5/22 385/131 |
| 2002/0014836 | A1 * | 2/2002 | Codama ............. H01L 27/3237 313/504 |
| 2013/0248867 | A1 * | 9/2013 | Kim .................... H01L 51/5253 257/59 |
| 2014/0021492 | A1 * | 1/2014 | Wolk ................. H01L 51/5275 257/88 |

FOREIGN PATENT DOCUMENTS

TW           201523871 A      6/2015

* cited by examiner

*Primary Examiner* — Fernando L Toledo
*Assistant Examiner* — Neil Prasad
(74) *Attorney, Agent, or Firm* — Bacon & Thomas, PLLC (57) ABSTRACT

An organic light emitting diode display panel is disclosed, which comprises: a substrate having a light emitting region and a non-light emitting region, wherein a first electrode layer is disposed on the light emitting region, a pixel defining layer is disposed on the non-light emitting region, and the pixel defining layer has a plurality of concave structures; an organic layer disposed on the first electrode layer and the pixel defining layer; and a second electrode layer disposed on the organic layer; wherein the organic layer is discontinuous at the concave structures.

15 Claims, 11 Drawing Sheets

ORGANIC LIGHT EMITTING DIODE DISPLAY PANEL

CROSS REFERENCE TO RELATED APPLICATION

This application claims the benefits of the Taiwan Patent Application Serial Number 104126504, filed on Aug. 14, 2015, the subject matters of which are incorporated herein by reference.

BACKGROUND

1. Field of the Invention

The present disclosure relates to an organic light emitting diode display panel. More particularly, the present disclosure relates to an organic light emitting diode display panel comprising a pixel defining layer with a special structure.

2. Description of Related Art

Organic light emitting diode (OLED) panel possesses advantages of light weight, thin thickness, high brightness, fast reaction speed, wide viewing angle, do not need backlight source, low cost, as well as bendability and flexibility. As a result, OLED panel has a great potential to be applied to display panels of various optoelectronic devices such as mobile phone panels, automobile panels, MP3 panels. However, OLED panel also possesses disadvantages of moisture intolerance.

For all the currently developed OLED panels, in order to enhance water resistance and air tightness of OLED panel, water resistant layer or protection layer is additionally applied to enhance water and oxygen resistances of display units and to prevent property deterioration by water and oxygen infiltrations. However, during the formation of water and oxygen resistant layers by deposition, internal stress may over-accumulate to cause pulling of organic material, creating defects. Especially when used as a flexible OLED panel, organic layer deformation may further increase, resulting organic layer delamination.

Therefore, there is a need to develop an OLED display panel, wherein adhesion of organic layer and layers thereon can be enhanced and delamination caused by internal stress or external stress generated by bending can be prevented.

SUMMARY

According to an embodiment of the present disclosure, an organic light emitting diode display panel comprises: a substrate having a light emitting region and a non-light emitting region, wherein a first electrode layer is disposed on the light emitting region, a pixel defining layer is disposed on the non-light emitting region, and the pixel defining layer has a plurality of concave structures; an organic layer disposed on the first electrode layer and the pixel defining layer; and a second electrode layer disposed on the organic layer; wherein the organic layer is discontinuous at the concave structures.

In an embodiment of a display panel of the present disclosure, a plurality of convex parts or a plurality of concave parts may be disposed on a first surface of the pixel defining layer to form the aforesaid concave structures. The first surface is away from the substrate. The convex parts or the concave parts comprise a sidewall and a bottom side. An angle included by the sidewall and the bottom side is 40° to 140°. The shape of the convex parts or the concave parts is not particularly limited. According to some embodiments, the angle between the sidewall and the bottom side is between 40° and 90°, the shape of the convex parts or the concave parts is an upright trapezoid at a cross-sectional line. According to some embodiments, the angle is at 90°, the convex parts or the concave part is a rectangle at a cross-sectional line. According to some embodiments, the angle is between 90° and 140°, the shape of the convex parts or the concave parts is an inverted trapezoid at a cross-sectional line.

In an embodiment of a display panel of the present disclosure, an area where the convex parts or the concave parts are disposed is 1% to 50% of an area of the first surface of the pixel defining layer. The distribution and location where the convex parts or the concave parts are disposed are not particularly limited.

In an embodiment of a display panel of the present disclosure, different layers may be disposed on the second electrode layer depending on different needs. Herein, an embodiment of a display panel of the present disclosure may further comprise an adhesion layer disposed on the second electrode layer and is continuous at the concave structures. The adhesion layer can be formed after curing a material with a viscosity of 1 cps to 10000 cps. A portion of the adhesion layer can be adhered to a part of the sidewall of the convex parts or the concave parts.

Accordingly, according to some embodiments, in the display panel of the present disclosure, by designing the pixel defining layer with a special concave structure, more specifically, a special structure with special concave or convex parts, the adhesion layer can form on sidewalls of the concave structure. Consequently, sliding of the organic layer in horizontal direction can be reduced and stress causing separation of the organic layer in vertical direction can be resisted. Adhesion between the second electrode layer and the organic layer under the adhesion layer can be enhanced. Overall adhesion of all layers can then be enhanced.

Other objects, advantages, and novel features of the present disclosure will become more apparent from the following detailed description when taken in conjunction with the accompanying drawings.

DETAILED DESCRIPTION

The present disclosure has been described in an illustrative manner, and it is to be understood that the terminology used is intended to be in the nature of description rather than of limitation. Many modifications and variations of the present disclosure are possible in light of the above teachings. Therefore, it is to be understood that within the scope of the appended claims, the invention may be practiced otherwise than as specifically described.

Hereinafter, terms such as "first" and "second" in the specification and claims are only intended to make clear distinction of elements with the same name. These terms do not mean these elements are used or manufactured in any sequence.

Embodiment 1

Figure 1A:
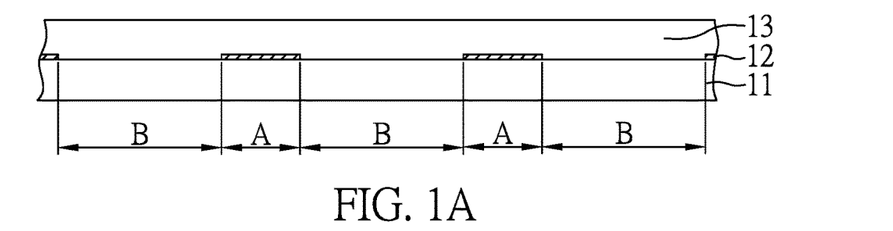
FIGS. 1A-1E are schematic diagrams showing a manufacturing process of a display panel of Embodiment 1 of the present disclosure in cross-sectional view.
Figure 1B:
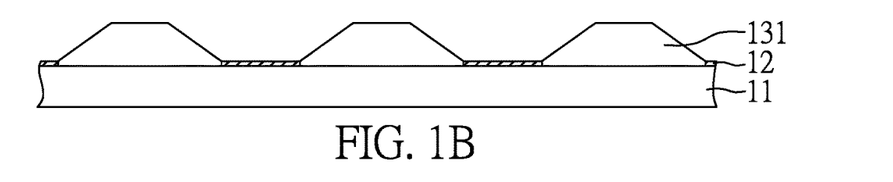

Please refer to FIGS. 1A-1E. FIGS. 1A-1E are schematic diagrams showing a manufacturing process of a display panel of the present embodiment in cross-sectional view. First, as shown in FIG. 1A, a substrate 11 is provided, which has light emitting regions A and non-light emitting regions B. A first electrode layer 12 is disposed on each light emitting region A. Next, a photoresist layer 13 is formed on the substrate 11 by a coating method. As shown in FIG. 1B, a base layer 131 is then formed on each non-light emitting region B after exposure and development. It should be noted here that since the major technical feature of the present disclosure is the design of the structure of the base layer 131 and the convex parts subsequently formed on the base layer 131; thus, the width of the non-light emitting regions B is enlarged and the width of the light emitting regions A is decreased for explanation purpose. However, the actual sizes of the light emitting regions A and the non-light emitting regions B depend on the panel design.

In the present embodiment, a material of the photoresist layer 13, which forms the base layer 131, may be a positive photoresist. In other words, it is a material in which the regions of the material exposed to light can be dissolved and washed away by a washing solvent after exposure and development. A material of the photoresist layer 13 may be phenol-formaldehyde resin or epoxy resin, such as Novolak, polyimide (PI), acrylic resin, cyclic olefin polymer (COP), etc.

Figure 1C:
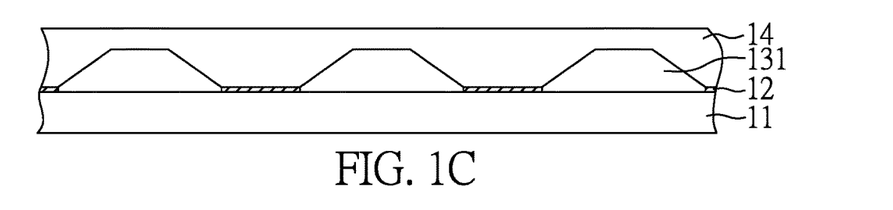
Figure 1D:
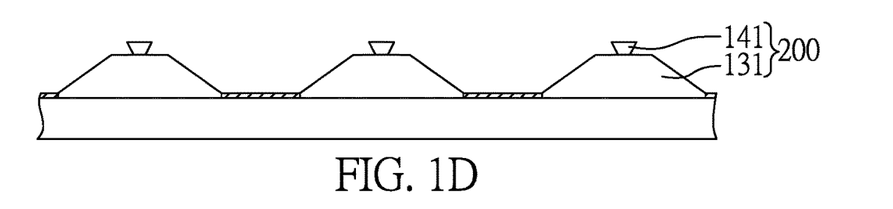

Next, as shown in FIG. 1C, another photoresist layer 14 is formed on the substrate 11 by a coating method. As shown in FIG. 1D, a plurality of convex parts 141 are formed on the base layer 131 in the non-light emitting regions B after exposure and development. In the present embodiment, a material of the photoresist layer 14, which forms the convex parts 141, may be a negative photoresist. In other words, it is a material in which the regions of the material exposed to light cannot be dissolved and washed away by a washing solvent after exposure and development. A material of the photoresist layer may be polyisoprene rubber, Novolak, etc.

The base layer 131 and the convex parts 141 are combined to form a pixel defining layer 200.

Figure 1E:
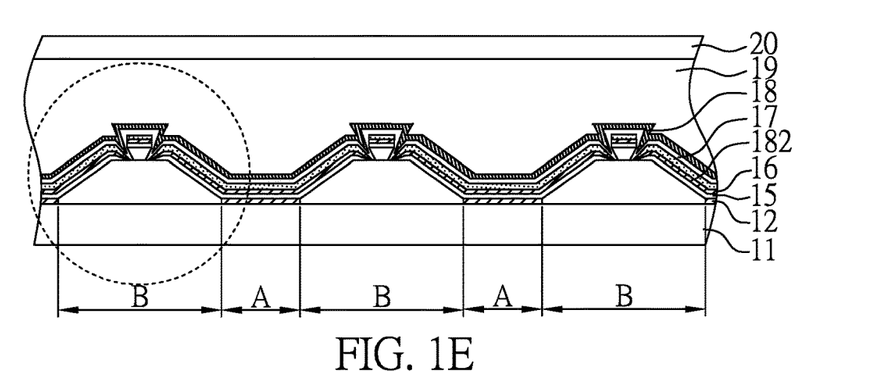

As shown in FIG. 1E, an organic layer 15 and a second electrode layer 16 are next formed on the substrate 11 sequentially to form an organic light emitting diode structure. An adhesion layer 17, a protection layer 18, and a planarization layer 19 are next formed on the organic light emitting diode structure sequentially. According to some embodiments, a counter substrate 20 can be assembled with the substrate 11, an organic light emitting diode display panel of the present embodiment is thus manufactured.

Figure 1F:
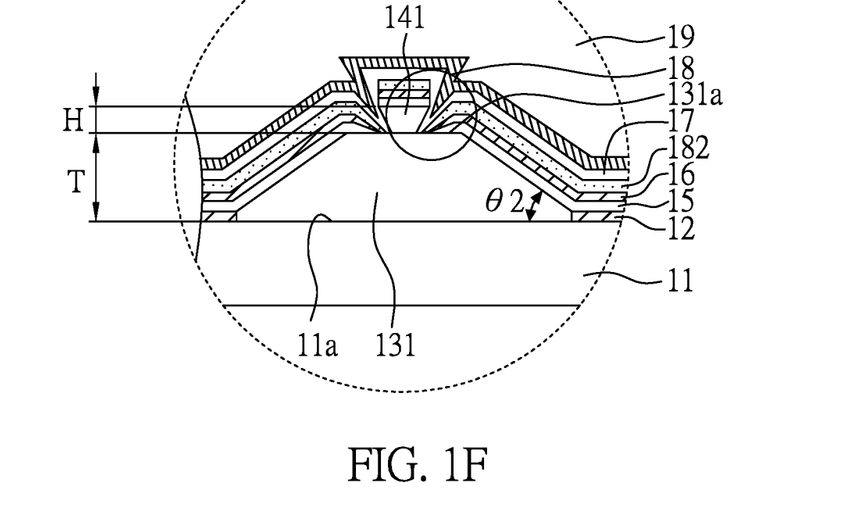
FIGS. 1F-1G are diagrams showing enlarged parts of a display panel of Embodiment 1 of the present disclosure.

FIG. 1F is a diagram showing the circled part of the display panel of FIG. 1E in enlarged view. As shown in FIGS. 1E-1F, a display panel of the present embodiment comprises: a substrate 11 having a light emitting region A and a non-light emitting region B, wherein a first electrode layer 12 is disposed on the light emitting region A, a pixel defining layer 200 is disposed on the non-light emitting region B, and the pixel defining layer 200 has a plurality of concave structures formed by a plurality of convex parts 141 and the base layer 131 (as shown by the solid circle); an organic layer 15 disposed on the first electrode layer 12 and the pixel defining layer 200; and a second electrode layer 16 disposed on the organic layer 15, wherein the organic layer 15 is interposed between the first electrode layer 12 and the second electrode layer 16. The base layer 131 has a first surface 131a, which is away from the substrate 11. The concave structures are defined by the convex parts 141 and the first surface 131a of the base layer 131. In the present embodiment, the organic layer 15 and the second electrode layer 16 are both discontinuous at the concave structures. However, in other embodiments of the present disclosure, the organic layer 15 is discontinuous at the concave structures but the second electrode layer 16 may be continuous at the concave structures.

Figure 1G:
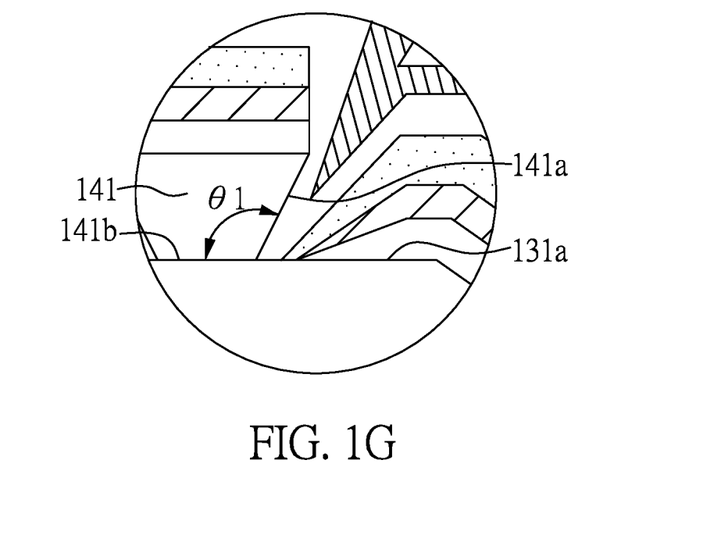

FIG. 1G is a diagram showing the circled part (solid circle) of the concave structures of FIG. 1F in enlarged view. As shown in FIGS. 1F-1G, in a display panel of the present embodiment, the plurality of convex parts 141 is disposed on the first surface 131a of the base layer 131. The convex parts 141 comprise a first sidewall 141a, and a first bottom side 141b (herein, the first bottom side 141b is the side/surface of the convex parts 141 that is in contact with the base layer 131). An angle θ1 is formed between the first sidewall 141a and the first bottom side 141b. The angle θ1 can be in the range of 40° to 140°. In the present embodiment, the angle θ1 between the first sidewall 141a and the first bottom side 141b of the convex parts 141 can be between 90° and 140°, the shape of the convex parts 141 is an inverted trapezoid at a cross-sectional line. In general, an angle θ2 between the base layer 131 and a surface of a layer underneath the base layer 131 (herein, a substrate surface 11a) is less than 40°. In addition, in a conventional structure, since no concave structure is formed in the pixel defining layer, the organic layer 15 and the second electrode layer 16 will not be discontinuous. In the present embodiment, since the concave structures are formed in the pixel defining layer 200, and formed by the convex parts 141 and the first surface 131a of the base layer 131, the organic layer 15 and the second electrode layer 16 can be discontinuous at the concave structures.

In the present embodiment, the concave structures in the pixel defining layer 200 can provide anchoring forces. As a result, not only sliding in horizontal direction can be reduced but stress causing separation in vertical direction can be resisted as well. At the same time, contact areas between the pixel defining layer 200 and subsequent layers can also be increased. Consequently, peeling due to panel bending caused by poor adhesion between the organic layer 15 and the pixel defining layer 200 as well as poor adhesion between the second electrode layer 16 and the pixel defining layer 200 can be prevented. Moreover, the concave structures of the pixel defining layer 200 can further provide relative resistance to external stress caused by panel bending. Therefore, encapsulation efficiency and resistance to bending of elements can be further enhanced. Thus, according to some embodiments, the OLED device can be more suitable for flexible display panel application.

Figure 2:
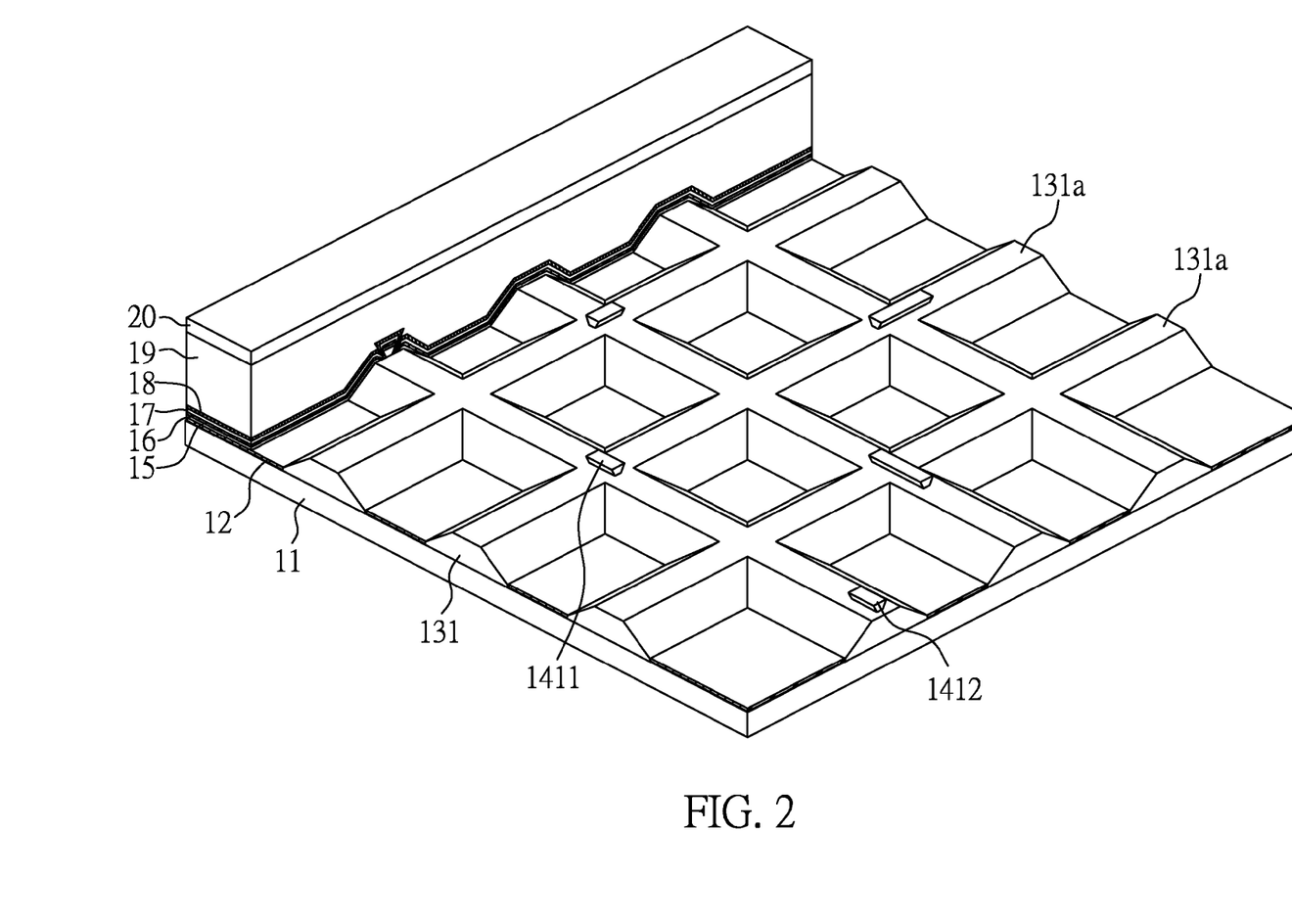
FIG. 2 is a schematic diagram showing a structure on a substrate of a display panel of Embodiment 1 of the present disclosure.

In the present embodiment, the size of the convex parts 141 is not particularly limited and may be changed according to different designs. For example, a height H of the convex parts 141 may be 0.1 times to 5 times of a thickness T of the base layer 131. A height H of the convex parts 141 may be 0.1 μm to 10 μm, such as 0.1 μm to 1 μm, to cause the organic layer and the second electrode layer to be discontinuous at the concave structures. Furthermore, as shown in FIG. 2, the locations where the convex parts 141 are disposed are not particularly limited. For example, the convex parts 141 may be disposed at crossed regions of the base layer 131 (as shown by 1411). The convex parts 141 may also be disposed at non-crossed regions (bar/strip regions) of the base layer 131 (as shown by 1412). The convex parts 141 may also be evenly distributed on the base layer 131. As shown in FIG. 2, an area where the convex parts 1411, 1412 are disposed can be 1% to 50% of an area of the first surface 131a of the base layer 131. In the present embodiment of the present disclosure, when the area where the convex parts are disposed is in the aforesaid range, the rigidity and the resistance to bending of organic light emitting diode panels can be enhanced. Here, "the convex parts are "evenly distributed" means that, for example, when every 1 to 8 light emitting regions is treated as a unit and at least one convex part is disposed on each of the said unit. However, the present disclosure is not limited thereto.

In the present embodiment, the first electrode layer 12, the organic layer 15, and the second electrode layer 16 are the only elements of organic light emitting diode described. However, the present disclosure is not limited thereto. Other elements of organic light emitting diode commonly used in the present technical field may also be applied in the organic light emitting diode display panels of the present disclosure. For example, electron transport layer, electron injection layer, hole transport layer, hole injection layer, and other layers that assist the transport and recombination of electrons and holes may also be applied in the present disclosure. For example, the organic layer 15 of the present embodiment may also comprises organic light emitting layer, electron transport layer, electron injection layer, hole transport layer, and hole injection layer.

In the present embodiment, the substrate 11 may be a transparent flexible substrate, such as a plastic substrate, or a rigid substrate, such as glass. The counter substrate 20 may be a transparent rigid or flexible substrate, such as a glass substrate, a plastic substrate, or the like. The first electrode layer 12 may be a reflective electrode, a transparent electrode, or a semi-transparent electrode. The second electrode layer 16 may be a transparent electrode, a semi-transparent electrode, or a reflective electrode. The reflective electrode may be an electrode made of Ag, Ge, Al, Cu, Mo, Ti, Sn, AlNd, or the like. The transparent electrode may be a transparent oxide electrode (TCO electrode), such as ITO electrode or IZO electrode. The semi-transparent electrode may be a metal thin-film electrode, such as a magnesium-silver alloy thin-film electrode, a gold thin-film electrode, a platinum thin-film electrode, an aluminum thin-film electrode, or the like. If needed, the second electrode layer 16 of the present embodiment may be a composite electrode of a transparent electrode and a semi-transparent electrode, such as a composite electrode of TCO electrode and a platinum thin-film electrode.

As shown in FIG. 1E, a display panel of the present embodiment further comprises an adhesion layer 17 disposed on the second electrode layer 16. The adhesion layer 17 may be formed after curing a material with a viscosity of 1 cps to 10000 cps. The viscosity of the adhesion layer 17 may be different depending on different manufacturing processes. For example, when ink-jet printing is used, the viscosity of the adhesion layer 17 may be 5 cps to 200 cps. Since the adhesion layer 17 is made of a material with high fluidity, the adhesion layer 17 may fill in the concave structures (as shown by the circled region (solid circle)) formed by the convex parts 141 and the base layer 131. Thus, the adhesion layer 17 is continuous at the concave structures. Here, the material forming the adhesion layer 17 may be a encapsulating plastic material in a liquid state. For example, the adhesion layer 17 can be acrylic resin, epoxy resin, silicone resin, or the mixtures thereof. Alternatively, the adhesion layer 17 may be a mixture material in a solution state formed by dissolving organic, inorganic, or organic-inorganic materials using a solvent of a specific proportion. The coating method of the material forming the adhesion layer 17 is not particularly limited. The coating method may be processes used for adhesion or coating of planar adhesives, such as screen printing, drip coating, slit coating, nozzle printing, spray printing, spin coating, micro-jet, ink-jet printing, and the like.

According to some embodiments, the adhesion layer 17 formed by the aforesaid processes and curing has higher adhesion, lower stress, higher toughness, and higher resistance to bending. The adhesion layer 17 can also adhere and fill the concave structures (as shown by the circled region (solid circle)) formed by the convex parts 141 and the base layer 131 partially, or even completely. For example, a portion of the adhesion layer 17 can adhere to a part of the first sidewall 141a of the convex parts 141. Hence, due to the strong adhesion of the adhesion layer 17, sliding of the organic layer 15 under the adhesion layer 17 in horizontal direction can be reduced. Stress causing separation of the organic layer 15 in vertical direction can be resisted. Adhesion between the second electrode layer 16 and the organic layer 15 can be enhanced. Peeling of the second electrode layer 16, the organic layer 15, and other layers with poorer adhesion can be prevented. Overall adhesion of all layers can then be enhanced. As the resistance to bending and the reliability of display panels and its products increase, their applicability in flexible organic light emitting diode display panel can be increased.

As shown in FIG. 1E, a display panel of the present embodiment further comprises a protection layer 18 disposed on the adhesion layer 17. The purpose of the protection layer 18 is mainly to block invasion or penetration of water vapor and oxygen to prevent deterioration of the organic layer 15 under the protection layer 18. Thus, the protection layer 18 may be a water-oxygen blocking layer. The protection layer can be inorganic material, organic material, or combination thereof. The protection layer can be a single layer, or multiple layers. A material of the protection layer 18 may be metal oxide, metal fluoride, metal nitride, metal carbide, metal carbonitride, metal nitrogen oxide, metal boride, metal boron oxide, metal silicide, silicon oxynitride, silicon nitride, and silicon oxide. For example, the protection layer 18 may be silicon nitride (SiN$_x$), silicon oxide (SiO$_x$), titanium dioxide (TiO$_2$), zirconium oxide (ZrO$_2$), aluminum oxide (Al$_2$O$_3$), aluminum nitride (AlN), or combinations thereof. The protection layer 18 can be continuous at the concave structures. Here, the protection layer 18 can be a single layer. However, in other embodiments of the present disclosure, the protection layer 18 may be a multi-layer structure formed by the aforesaid inorganic materials. The protection layer 18 may also be a multi-layer structure formed by stacking organic material and inorganic material sequentially. The main purpose of the protection layer 18 is to enhance the water-oxygen blocking ability of elements. A display panel of the present embodiment may further comprise another protection layer 182 underneath the adhesion layer 17 (in between the adhesion layer 17 and the second electrode layer 16). In the present disclosure, by forming the protection layer 182 in between the adhesion layer 17 and the second electrode layer 16, possible erosion of the second electrode layer 16 caused by direct contact with the adhesion layer 17 can be prevented. In addition, the protection layer 182 may also prevent invasion or penetration of water vapor caused by different process environments during subsequent preparation of the adhesion layer 17.

To simplify description of the following embodiments of the present disclosure, the protection layer 182 underneath the adhesion layer 17 is omitted. However, the display panels of the following embodiments may comprise the protection layer 182 underneath the adhesion layer 17.

As shown in FIGS. 1E-1F, a display panel of the present embodiment further comprises a planarization layer 19 disposed on the protection layer 18. The material of the planarization layer 19 is not particularly limited. For example, a material of the planarization layer 19 may be an insulation material. The planarization layer 19 may be formed using a material with an appropriate viscosity by a feasible manufacturing process. The purpose of the planarization layer 19 is to achieve desired planarization requirement.

Embodiment 2

FIGS. 3A-3D are schematic diagrams showing a manufacturing process of a display panel of the present embodiment in cross-sectional view. The structure and manufacturing process of display panels of the present embodiment are similar to that of Embodiment 1 except the following.

Figure 3A:
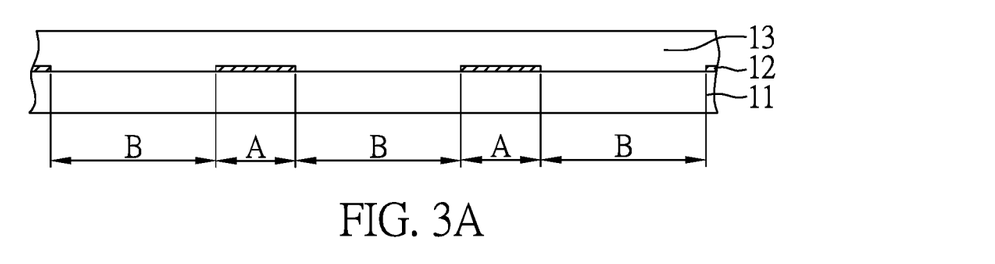
FIGS. 3A-3D are schematic diagrams showing a manufacturing process of a display panel of Embodiment 2 of the present disclosure in cross-sectional view.
Figure 3B:
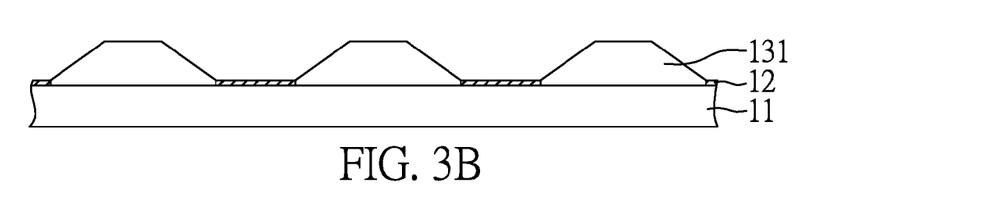
Figure 3C:
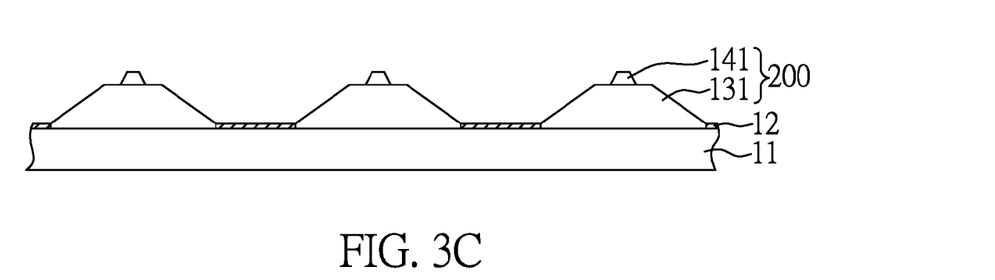
Figure 3D:
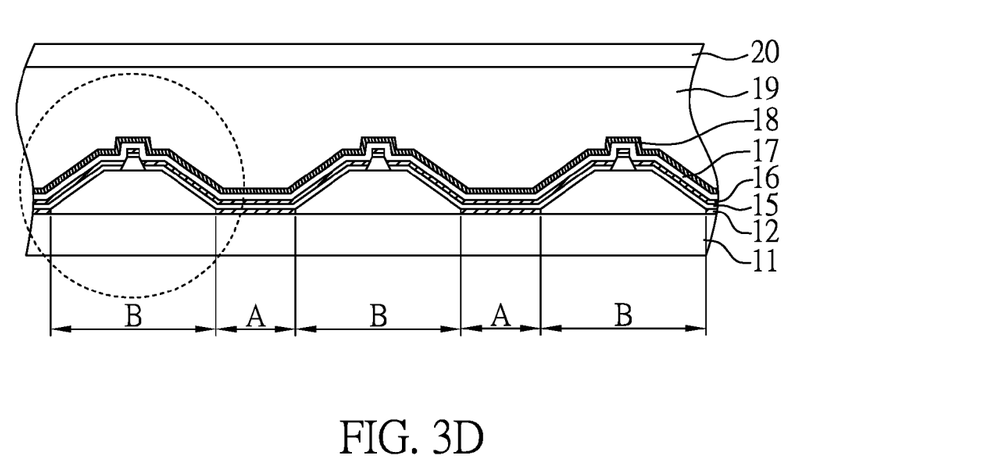

As shown in FIGS. 3A-3B, after the base layer 131 is formed, a positive photoresist is used to form the convex parts 141 on the base layer 131. As shown in FIG. 3C, the shape of the convex parts 141 is an upright trapezoid at a cross-sectional line. Since the positive photoresist used to form the convex parts 141 may be the same as the positive photoresist used to form the base layer 131, its description will not be repeated here again. FIG. 3D shows a structure of a display panel formed when using positive photoresist to form the convex parts 141.

Figure 3E:
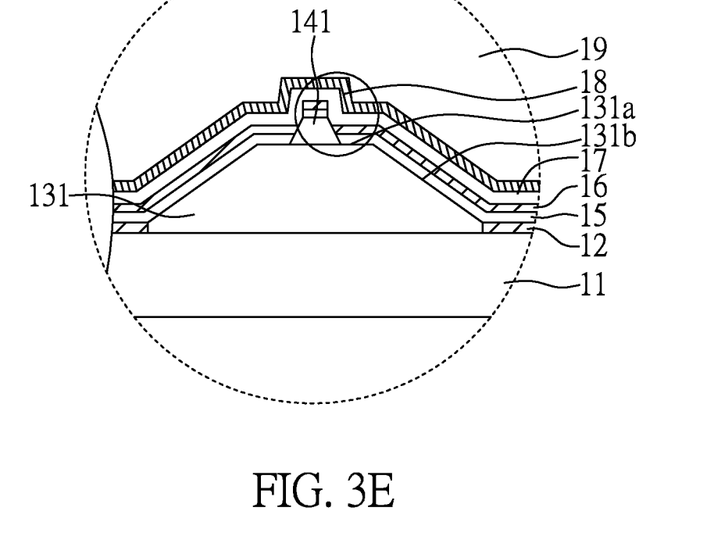
FIGS. 3E-3F are diagrams showing enlarged parts of a display panel of Embodiment 2 of the present disclosure.
Figure 3F:
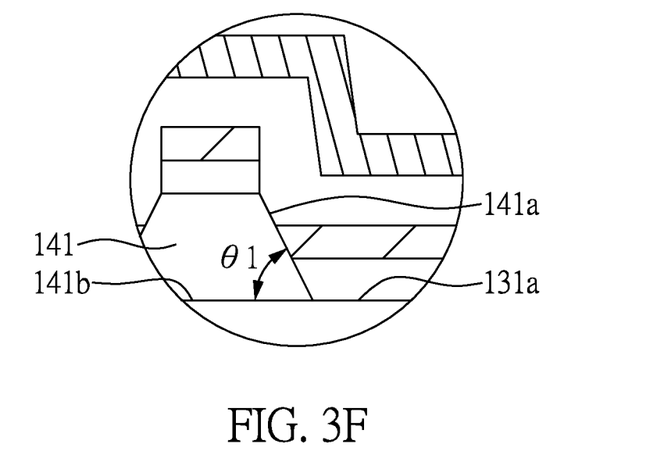

FIG. 3E is a diagram showing the circled part of the display panel of FIG. 3D in enlarged view. FIG. 3F is a diagram showing the circled part (solid circle) of the concave structures of FIG. 3E in enlarged view. Different from the shape of an inverted trapezoid of the convex parts 141 of Embodiment 1, the shape of the convex parts 141 of the present embodiment is an upright trapezoid. The convex parts 141 comprise a first sidewall 141a, a first bottom side 141b (herein, the first bottom side 141b is the side/surface of the convex parts 141 that is in contact with the base layer 131), and an angle θ1 between the first sidewall 141a and the first bottom side 141b of 40° to 90°. Thus, the shape of the convex part 141 is an upright trapezoid at a cross-sectional line.

In the present embodiment, since the base layer 131 and the convex parts 141 are both formed using positive photoresist, the materials of the base layer 131 and the convex parts 141 may be the same or different. The base layer 131 and the convex parts 141 are combined to form the pixel defining layer 200.

Embodiment 3

Figure 4A:
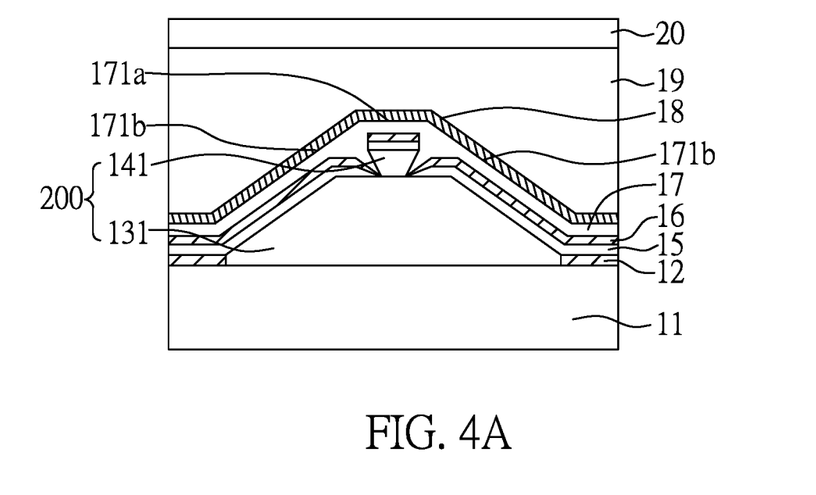
FIG. 4A is a diagram showing an enlarged part of a display panel of Embodiment 3 of the present disclosure.

FIG. 4A is a diagram showing an enlarged part of a display panel of the present embodiment. The structure and manufacturing process of display panels of the present embodiment are similar to Embodiment 1 except the following. As shown in FIG. 4A, the adhesion layer 17 has a shape similar to an upright trapezoid at a cross-sectional line. The adhesion layer 17 has a top side 171a and two sidewalls 171b. The top side 171a and the two sidewalls 171b are connected. The top side 171a and each of the two sidewalls 171b form an obtuse angle. Subsequently, when the protection layer 18 is formed on the adhesion layer 17, the protection layer 18 also has a shape similar to an upright trapezoid like the adhesion layer 17. Compared to the protection layer 18 of Embodiment 1, which has a shape similar to an inverted trapezoid and an acute angle, the protection layer 18 of the present embodiment has a shape similar to an upright trapezoid and an obtuse angle. Thus, possible defects at the acute structures of the protection layer 18 of Embodiment 1 can be prevented in the present embodiment.

Embodiment 4

Figure 4B:
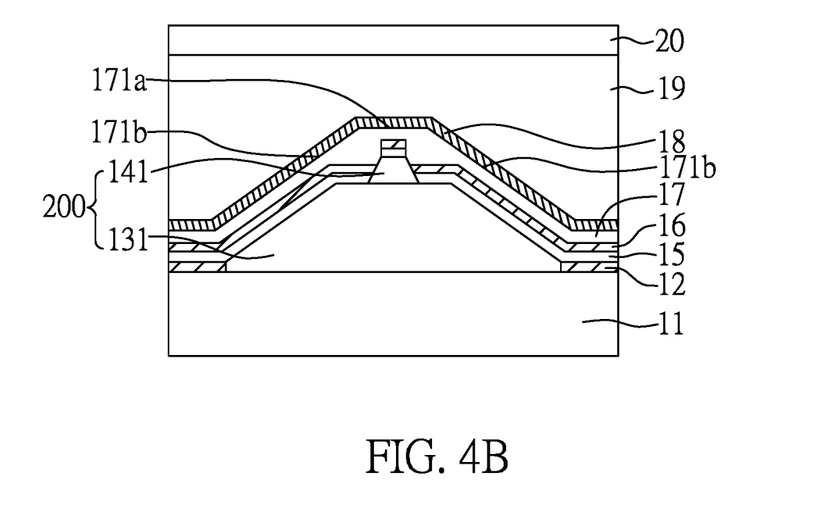
FIG. 4B is a diagram showing an enlarged part of a display panel of Embodiment 4 of the present disclosure.

FIG. 4B is a diagram showing an enlarged part of a display panel of the present embodiment. The structure and manufacturing process of display panels of the present embodiment are similar to Embodiment 2 except the following. As shown in FIG. 4B, the adhesion layer 17 has a shape similar to an upright trapezoid at a cross-sectional line. The adhesion layer 17 has a top side 171a and two sidewalls 171b. The top side 171a and the two sidewalls 171b are connected. The top side 171a and each of the two sidewalls 171b form an obtuse angle.

Embodiment 5

Figure 5A:
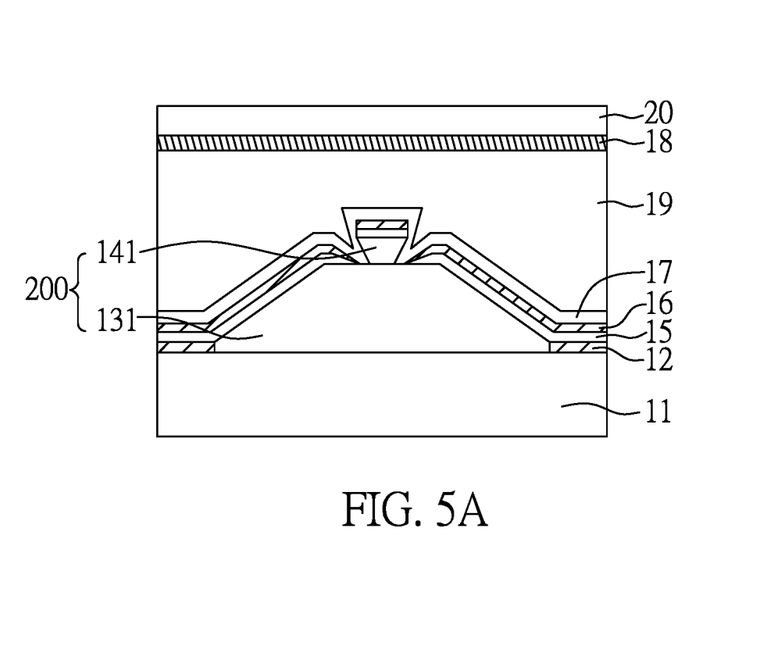
FIG. 5A is a diagram showing an enlarged part of a display panel of Embodiment 5 of the present disclosure.

FIG. 5A is a diagram showing an enlarged part of a display panel of the present embodiment. The structure and manufacturing process of display panels of the present embodiment are similar to Embodiment 1 except the following. As shown in FIG. 5A, the planarization layer 19 is formed after the formation of the adhesion layer 17. The protection layer 18 is formed after the formation of the planarization layer 19. Thus, in the present embodiment, the planarization layer 19 is disposed between the adhesion layer 17 and the protection layer 18. In the present embodiment, the counter substrate 20 is assembled directly after the formation of the protection layer 18. However, in other embodiments of the present disclosure, other layers may also form in between the protection layer 18 and the counter substrate 20. For example, another planarization layer may form in between the protection layer 18 and the counter substrate 20. Since the protection layer 18 of the present embodiment does not have edges and corners (angularity), possible defects at the acute structures of the protection layer 18 of Embodiment 1 can be prevented in the present embodiment.

Embodiment 6

Figure 5B:
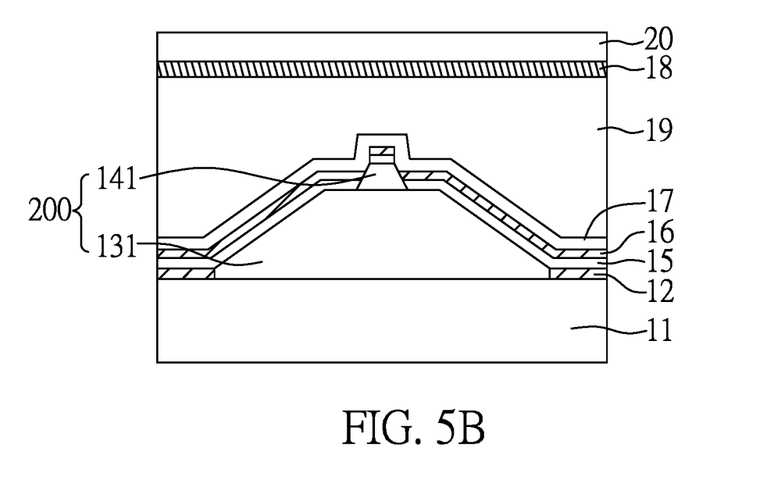
FIG. 5B is a diagram showing an enlarged part of a display panel of Embodiment 6 of the present disclosure.

FIG. 5B is a diagram showing an enlarged part of a display panel of the present embodiment. The structure and manufacturing process of display panels of the present embodiment are similar to Embodiment 2 except the following. As shown in FIG. 5B, similar to Embodiment 5, the planarization layer 19 is formed after the formation of the adhesion layer 17. The protection layer 18 is formed after the formation of the planarization layer 19.

Embodiment 7

Figure 6A:
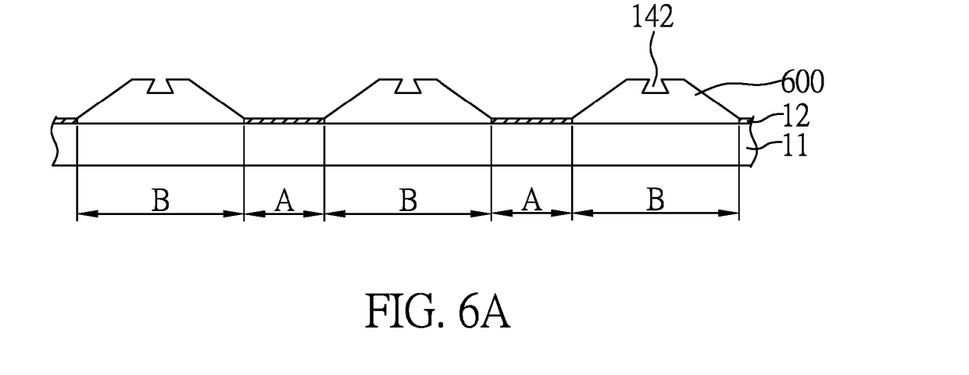
FIGS. 6A-6B are schematic diagrams showing a manufacturing process of a display panel of Embodiment 7 of the present disclosure in cross-sectional view.
Figure 6B:
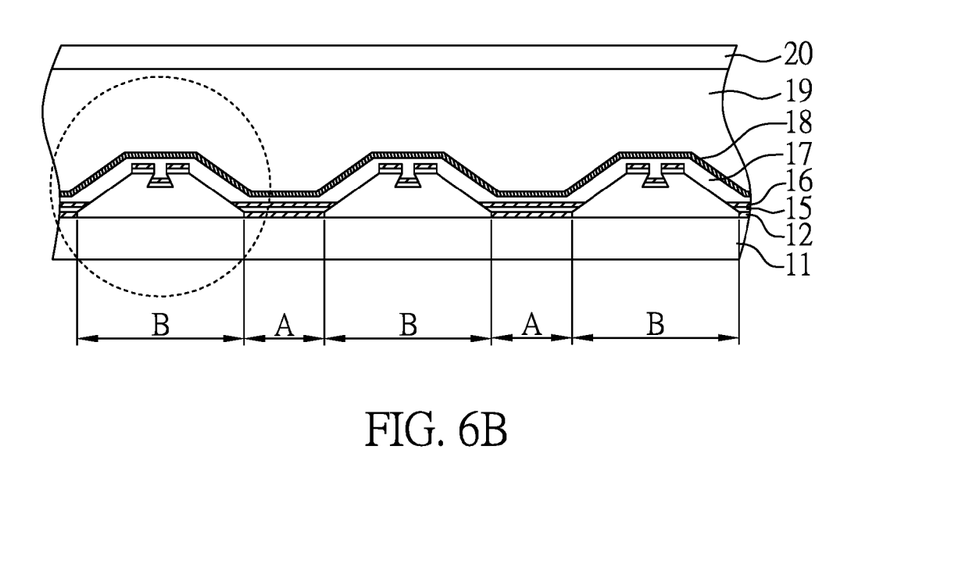

FIGS. 6A-6B are schematic diagrams showing a manufacturing process of a display panel of the present embodiment in cross-sectional view. The structure and manufacturing process of display panels of the present embodiment are similar to Embodiment 1 except the following.

As shown in FIG. 6A, first, a photoresist layer (not shown) is formed. Then, a plurality of concave parts 142 is formed by patterning processes such as multi-stage etching or by using laser, plasma bombardment, and the like. Thus, a pixel defining layer 600 including a plurality of concave parts 142 is formed. The shape of the concave parts 142 formed is an upright trapezoid at a cross-sectional line. The concave parts 142 formed in the present embodiment can have similar function to the convex parts 141 formed in Embodiment 1. As shown in FIG. 6B, the organic layer 15, the second electrode layer 16, the adhesion layer 17, the protection layer 18, and the planarization layer 19 can be formed subsequently and sequentially with the same manner as in Embodiment 1.

Figure 6C:
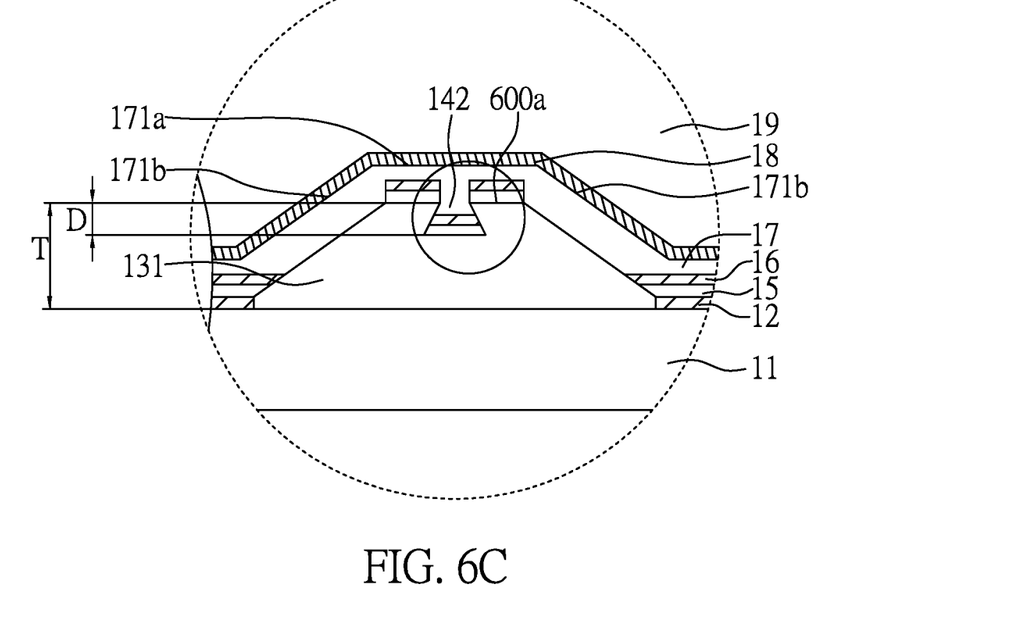
FIGS. 6C-6D are diagrams showing enlarged parts of a display panel of Embodiment 7 of the present disclosure.
Figure 6D:
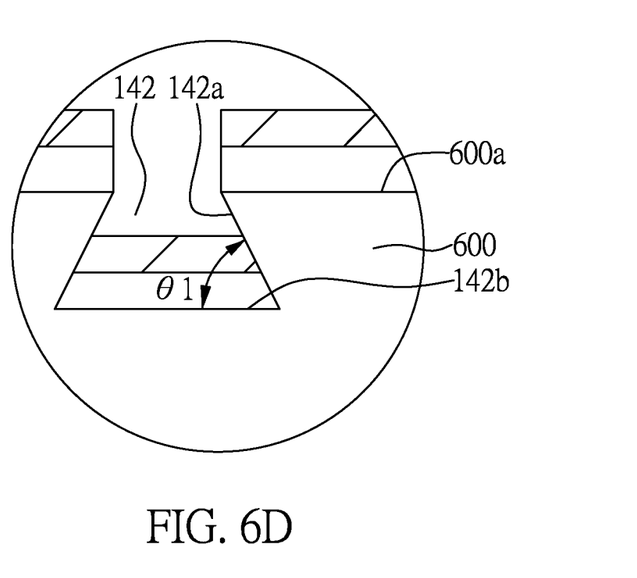

FIG. 6C is a diagram showing the circled part of the display panel of FIG. 6B in enlarged view. FIG. 6D is a diagram showing the circled part (solid circle) of the concave structures of FIG. 6C in enlarged view. As shown in FIGS. 6C-6D, in a display panel of the present embodiment, the plurality of concave parts 142 is formed in a second surface 600a of the pixel defining layer 600. The second surface 600a is away from a surface of the substrate 11. The concave parts 142 comprise a second sidewall 142a, a second bottom side 142b, and an angle θ1 between the second sidewall 142a and the second bottom side 142b of 40° to 140°. In the present embodiment, since the angle θ1 between the second sidewall 142a and the second bottom side 142b of the concave parts 142 is between 40° and 90°, the shape of the concave parts 142 is an upright trapezoid at a cross-sectional line. In the present disclosure, by forming the concave parts 142 in the pixel defining layer 600, the concave structures having an angle θ1 of 40° to 140° are formed. Thus, in the present disclosure, both the organic layer 15 and the second electrode layer 16 are discontinuous at the concave structures. However, in other embodiments of the present disclosure, the organic layer 15 is discontinuous at the concave structures while the second electrode layer 16 is continuous at the concave structures.

In the present embodiment, the size of the concave parts 142 is not particularly limited and may be changed according to different designs. For example, a depth D of the concave parts 142 may be 5% to 50% of a thickness T of the pixel defining layer 600. The location and area where the concave parts 142 are disposed are not particularly limited. Since the concave parts 142 may be disposed in the pixel defining layer 600 using the similar manner as in Embodiment 1, its description will not be repeated here again. For example, an area where the concave parts 142 are disposed can be 1% to 50% of an area of the second surface 600a of the pixel defining layer 600.

In the present embodiment, the adhesion layer 17 and the protection layer 18 have similar structures as in Embodiment 3. As shown in FIG. 6C, the adhesion layer 17 has filled in the concave parts 142. In addition, the adhesion layer 17 has a shape similar to an upright trapezoid at a cross-sectional line. In the present embodiment of the present disclosure, the adhesion layer 17 may also fill in the concave structures. A portion of the adhesion layer 17 may adhere to a part of the second sidewall 142a of the concave parts 142. The adhesion layer 17 has a top side 171a and two sidewalls 171b. The top side 171a and the two sidewalls 171b are connected. The top side 171a and each of the two sidewalls 171b form an obtuse angle. Subsequently, when the protection layer 18 is formed on the adhesion layer 17, the protection layer 18 also has a shape similar to an upright trapezoid like the adhesion layer 17.

Embodiment 8

Figure 7A:
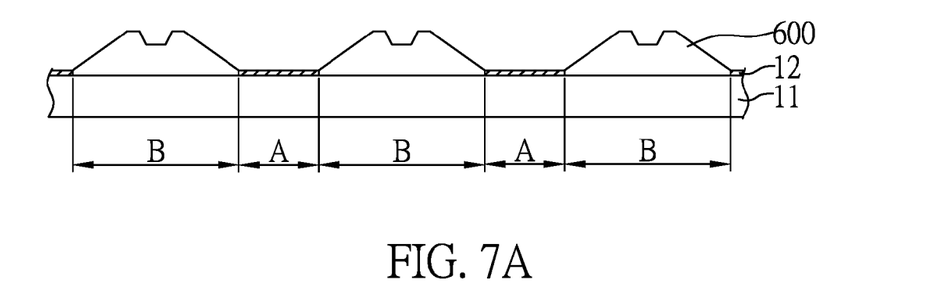
FIGS. 7A-7B are schematic diagrams showing a manufacturing process of a display panel of Embodiment 8 of the present disclosure in cross-sectional view.
Figure 7B:
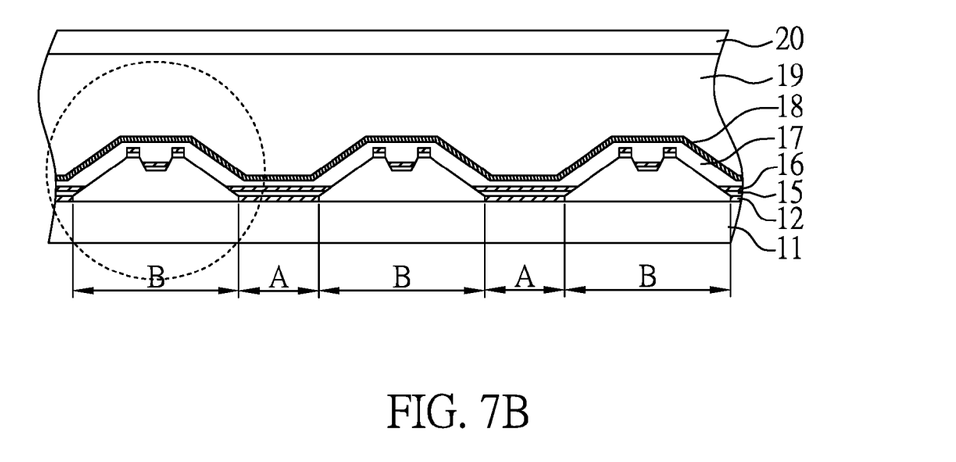

FIGS. 7A-7B are schematic diagrams showing a manufacturing process of a display panel of the present embodiment in cross-sectional view. The structure and manufacturing process of display panels of the present embodiment are similar to Embodiment 7 except the following.

In the present embodiment, the shape of the concave parts 142 formed is an inverted trapezoid at a cross-sectional line. Since the concave parts 142 are formed using the same manner as in Embodiment 7, its description will not be repeated here again.

Figure 7C:
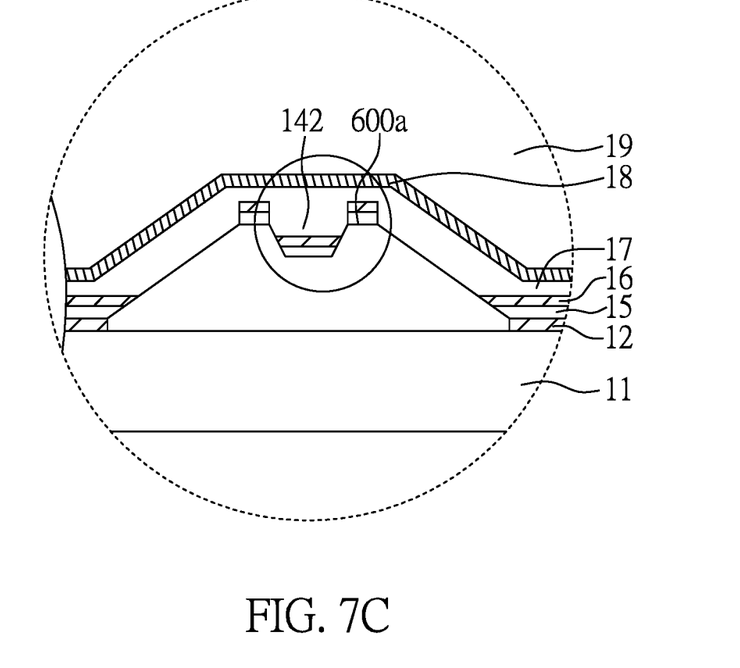
FIGS. 7C-7D are diagrams showing enlarged parts of a display panel of Embodiment 8 of the present disclosure.
Figure 7D:
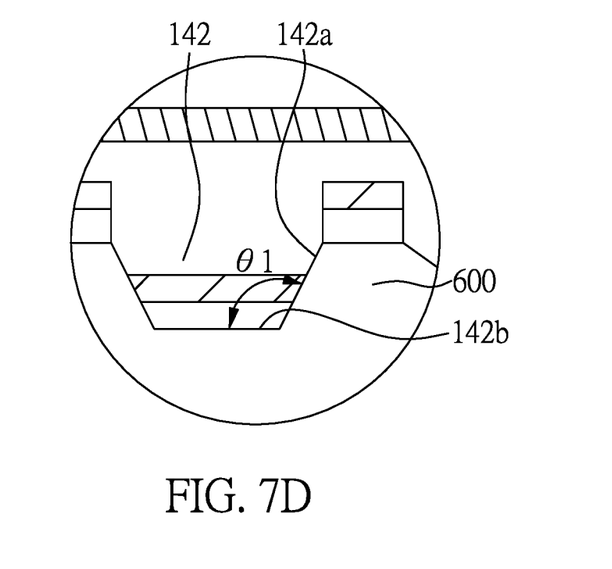

FIG. 7C is a diagram showing the circled part of the display panel of FIG. 7B in enlarged view. FIG. 7D is a diagram showing the circled part (solid circle) of the concave structures of FIG. 7C in enlarged view. Different from the concave parts 142 having the shape of an upright trapezoid of Embodiment 7, the concave parts 142 of the present embodiment have the shape of an inverted trapezoid. The concave parts 142 comprise a second sidewall 142a, a second bottom side 142b, and an angle θ1 between the second sidewall 142a and the second bottom side 142b of 40° to 140°. In the present embodiment, since the angle θ1 between the second sidewall 142a and the second bottom side 142b of the concave parts 142 is between 90° and 140°, the shape of the concave parts 142 is an inverted trapezoid at a cross-sectional line.

Accordingly, in the present disclosure, according to some embodiments, by means of the concave structures of the pixel defining layer, the organic layer can be discontinuous at the concave structures. In addition, since the adhesion layer can partially or completely fill in the concave structures, the adhesion layer can be continuous at the concave structures. The adhesion layer can form on the sidewalls of the concave structures. As a result, sliding of the organic layer in horizontal direction can be reduced and stress causing separation of the organic layer in vertical direction can be resisted. Moreover, adhesion between the second electrode layer and the organic layer under the adhesion layer can be enhanced. Thereby, overall adhesion of all layers can then be enhanced.

In the present disclosure, according to some embodiments, the display panels manufactured may also be used with any touch panels known in the present technical field together to form touch display devices. The display panels or the touch display devices manufactured i may be used in any electronic devices requiring display screens known in the present technical field. For example, monitors, mobile phones, laptop computers, video cameras, cameras, music players, mobile navigation devices, televisions, and the like.

Although the present disclosure has been explained in relation to its embodiments, it is to be understood that many other possible modifications and variations can be made without departing from the spirit and scope of the present disclosure as hereinafter claimed.

What is claimed is:

1. An organic light emitting diode display panel, comprising:
    a substrate having a light emitting region and a non-light emitting region, wherein a first electrode layer is disposed on the light emitting region, a pixel defining layer is disposed on the non-light emitting region, and the pixel defining layer has a plurality of concave structures;
    an organic layer disposed on the first electrode layer and the pixel defining layer;
    a second electrode layer disposed on the organic layer;
    a first protection layer disposed on the second electrode layer; and
    a second protection layer disposed on the first protection layer;
    wherein the first protection layer is discontinuous at the concave structures, the second protection layer is continuous at the concave structures, and the first protection layer is separated from the second protection layer at the concave structures.

2. The display panel as claimed in claim 1, wherein the pixel defining layer includes a plurality of convex parts or a plurality of concave parts.

3. The display panel as claimed in claim 2, wherein the pixel defining layer includes a base layer and the plurality of convex parts disposed on a first surface of the base layer, wherein the first surface is away from the substrate.

4. The display panel as claimed in claim 2, wherein the plurality of convex parts comprises a first sidewall and a first bottom side, wherein an angle included by the first sidewall and the first bottom side is 40° to 140°.

5. The display panel as claimed in claim 4, further comprising an adhesion layer disposed on the first protection layer, the adhesion layer is continuous at the concave structures, and the adhesion layer is adhered to a part of the first sidewall of the convex parts.

6. The display panel as claimed in claim 3, wherein an area where the convex parts are disposed is 1% to 50% of an area of the first surface of the base layer.

7. The display panel as claimed in claim 2, wherein the pixel defining layer includes the plurality of concave parts.

8. The display panel as claimed in claim 7, wherein the plurality of concave parts comprises a second sidewall and a second bottom side, wherein an angle included by the second sidewall and the second bottom side is 40° to 140°.

9. The display panel as claimed in claim 8, further comprising an adhesion layer disposed on the first protection layer, the adhesion layer is continuous at the concave structures, and the adhesion layer is adhered to a part of the second sidewall of the concave parts.

10. The display panel as claimed in claim 7, wherein an area where the concave parts are disposed is 1% to 50% of an area of a second surface of the pixel defining layer, and the second surface is away from the substrate.

11. The display panel as claimed in claim 1, further comprising an adhesion layer disposed on the first protection layer, and the adhesion layer is continuous at the concave structures.

12. The display panel as claimed in claim 11, wherein the adhesion layer is acrylic resin, epoxy resin, silicone resin, or the mixtures thereof.

13. The display panel as claimed in claim 11, wherein the second protection layer is disposed on the adhesion layer.

14. The display panel as claimed in claim 11, further comprising a planarization layer disposed on the second protection layer or between the adhesion layer and the second protection layer.

15. The display panel as claimed in claim 11, wherein the adhesion layer is formed after curing a material with a viscosity of 1 cps to 10000 cps.

* * * * *